United States Patent
Zaveri et al.

(10) Patent No.: US 6,249,143 B1
(45) Date of Patent: *Jun. 19, 2001

(54) PROGRAMMABLE LOGIC ARRAY INTEGRATED CIRCUIT WITH DISTRIBUTED RANDOM ACCESS MEMORY ARRAY

(75) Inventors: Ketan Zaveri, San Jose; Richard Cliff, Milpitas; Srinivas Reddy, Santa Clara, all of CA (US)

(73) Assignee: Altera Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/007,718

(22) Filed: Jan. 15, 1998

Related U.S. Application Data

(60) Provisional application No. 60/047,625, filed on May 23, 1997.

(51) Int. Cl.[7] .................... G06F 7/38; H03K 19/177
(52) U.S. Cl. ........................................ 326/40; 326/39
(58) Field of Search .................. 326/39, 40, 41, 326/47, 38

(56) References Cited

U.S. PATENT DOCUMENTS

| | | |
|---|---|---|
| 4,706,216 | 11/1987 | Carter . |
| 4,780,846 * | 10/1988 | Tanabe et al. .................. 365/63 |
| 4,870,302 | 9/1989 | Freeman . |
| 5,274,581 | 12/1993 | Cliff et al. . |
| 5,343,406 | 8/1994 | Freeman et al. . |
| 5,352,940 | 10/1994 | Watson . |
| 5,386,154 | 1/1995 | Goetting et al. . |
| 5,414,377 | 5/1995 | Freidin . |
| 5,481,486 | 1/1996 | Cliff et al. . |
| 5,550,782 * | 8/1996 | Cliff et al. ...................... 365/230.03 |
| 5,566,123 | 10/1996 | Freidin et al. . |
| 5,570,040 | 10/1996 | Lytle et al. . |
| 5,572,148 * | 11/1996 | Lytle et al. ...................... 326/41 |
| 5,581,198 | 12/1996 | Trimberger . |
| 5,644,251 * | 7/1997 | Colwell et al. .................. 326/16 |
| 5,689,195 * | 11/1997 | Cliff et al. ...................... 326/41 |
| 5,705,938 * | 1/1998 | Kean ............................. 326/39 |
| 5,744,980 * | 4/1998 | McGowan et al. ............... 326/40 |

OTHER PUBLICATIONS

Actel, "Actel's Reprogrammable SPGAs," Actel Corporation, Preliminary Advance Information (Oct. 10, 1996), pp. 1, 8–9.

AT&T Microelectronics, "ORCA FPGAs Excel in Multiplexing and On–Chip SRAM Applications," (Article Reprinted from App Review, Apr. 11, 1994), Application Note (Dec. 1995), pp. 1–4.

Bursky, Dave, "Programmable Arrays Mix FPGA And ASIC Blocks," Electronic Design, pp. 69–74, (Oct. 14, 1996).

Ngai, T, et al., "A New Generation of ORCA FPGA with Enhanced Features and Performance," IEEE 1996 Custom Integrated Circuits Conference, pp. 247–250.

Xilinx, Inc., "XC4000 Series Field Programmable Gate Arrays," Product Specification, V. 1.04, pp. 4–5–4–24 (Sep. 18, 1996).

* cited by examiner

Primary Examiner—Michael Tokar
Assistant Examiner—Daniel D. Chang
(74) Attorney, Agent, or Firm—Morrison & Foerster LLP

(57) ABSTRACT

A programmable logic array integrated circuit is provided which comprises: a plurality of logic array blocks in which respective logic array blocks include, multiple respective programmable logic elements and respective random access memory arrays and corresponding memory access control circuitry and respective shared programmable local interfaces; and a network of conductors which is programmable to connect a respective local interface circuit of substantially any logic array block to a respective local interface of substantially any other logic array block.

33 Claims, 10 Drawing Sheets

PROGRAMMABLE LOGIC ARRAY INTEGRATED CIRCUIT WITH DISTRIBUTED RANDOM ACCESS MEMORY ARRAY

This application is a regular U.S. patent application of U.S. provisional application Ser. No. 60/047,625 filed May 23, 1997.

BACKGROUND OF THE INVENTION

1. Field of the Invention

The invention relates generally to programmable logic array integrated circuits and more particularly to programmable array logic integrated circuits having improved random access memory.

2. Description of the Related Art

Commonly assigned U.S. Pat. No. 5,550,782 entitled Programmable Logic Array Integrated Circuits, which issued Aug. 27, 1996, shows programmable logic array integrated circuits which are highly modular. FIGS. 1 and 10 of that patent illustrate a multiplicity of programmable logic array modules distributed about the array in a two-dimensional pattern of rows and columns. FIGS. 11 and 20–24 of that patent illustrate the distribution of multiple dedicated random access memory blocks at various row and column locations throughout the array. FIGS. 1 and 10 of that patent also illustrate a plurality of global horizontal and global vertical conductors which extend along what shall be referred to herein as a vertical dimension between respective columns of modules and/or memory blocks and what shall be referred to herein as in a horizontal direction between respective rows of modules and/or memory blocks. The programmable logic modules and the random access memory blocks can be programmably connected to the global horizontal or to the global vertical conductors. Moreover, each module has a local interface to adjacent global conductors, and each random access memory block also has a local interface to adjacent global conductors.

U.S. Pat. No. 4,870,302 entitled Configurable Electrical Circuit Having Configurable Logic Elements And Configurable Elements, which is assigned to Xilinx, Inc., issued on Sep. 26, 1989. FIGS. 3A–3D of that patent show the use of a 16 bit random access memory as configurable logic elements which can be programmed to produce a logical function. FIG. 4A of that patent illustrates the distribution of a plurality of random access memory configurable logic elements in a two-dimensional array about the configurable electrical circuit.

The application note from Xilinx, Inc. entitled, *XC4000 Series Field Programmable Gate Arrays*, dated Sep. 18, 1996 discloses the implementation of either single-port or dual-port edge-triggered RAM and the implementation of level-sensitive single port RAM from configurable logic blocks in a field programmable gate array.

The application note by AT&T Microelectronics dated December 1995 entitled *ORCA FPGAs Excel in Multiplexing and On-Chip SRAM Applications*, discloses the use of look-up tables (LUTs) in a field programmable gate array (FPGA) to implement static random access memory (SRAM) blocks or read only memory (ROM) blocks. The note discloses, for example, how a single logic element, referred to as a programmable function unit or PFU, can be used to implement one 16×4 SRAM block or two 16×2 SRAM blocks with the remainder of the PFU used for random logic. T. Ngai, et al., in *A New Generation of ORCA FPGA with Enhanced Features and Performance*, IEEE 1996 Custom Integrated Circuits Conference, discloses the use of LUTs in PFUs to implement synchronous 16×4 memory and to implement synchronous 16×2 dual-port memory.

Increasingly, there are applications such as networking, for instance, that call for random access memory that is both "shallow" and "wide." While random access memory in programmable logic arrays as described above generally has been available, there is a need for more efficient use of array resources in providing such shallow and wide memory. For example, the random access memory array blocks disclosed in U.S. Pat. No. 5,550,782 are relatively "deep." For example, a 256×8 memory block is 256 bits deep and 8 bits wide, and digital information typically is read or written 8 bits at a time. Since networking and communications applications often require primarily shallow and wide memory, a significant portion of a memory block often remains unused in these applications, and the space occupied by that block, which otherwise could be used for programmable logic, is wasted. Although smaller memory blocks can be produced by configuring one or more look-up tables as random access memory, as described in the references discussed above for example, these memory blocks typically are produced by consuming LUT resources that otherwise could be programmed to provide logic finctions.

Thus, there has been a need for a programmable array logic circuit which more efficiently uses array resources in providing random access memory blocks. In particular, there has been a need for more efficient implementation of shallow and wide memory. The present invention meets this need.

SUMMARY OF THE INVENTION

In one aspect, the present invention provides a programmable logic array integrated circuit which includes a plurality of programmable logic modules, each of which includes multiple programmable logic elements and a random access memory array which is dedicated to the storage of user information. A programmable network of conductors can be programmed to interconnect substantially any of the plurality of logic modules.

In another aspect, a programmable logic array integrated circuit comprises a plurality of logic array blocks. Respective logic array blocks include multiple respective programmable logic elements and respective random access memory arrays and corresponding memory access control circuitry and a respective programmable local interface. A programmable network of conductors can be programmed to connect a respective local interface circuit of substantially any logic array block to a respective local interface of substantially any other logic array block.

A further aspect of the invention provides a programmable logic array integrated circuit which includes a multiplicity of programmable logic elements disposed on the circuit in a two-dimensional array. A multiplicity of random access memory arrays are also disposed on the circuit throughout the two-dimensional array. A multiplicity of programmable local interface circuits, provide shared local interfaces to both programmable logic elements and to dedicated random access memory arrays. A programmable network of global connectors, which includes a first plurality of conductors extending along a first dimension of the two-dimensional array and a second plurality of conductors extending along a second dimension of the two-dimensional array, is programmable to interconnect substantially any of the respective programmable local interface circuits.

Thus, many relatively small random access memory arrays are distributed throughout the integrated circuit.

These random access memory arrays can be used to dynamically store communication or network information. Little or no sacrifice of programmable logic is required to produce such distributed memory. Moreover, since the random access memory array are relatively small, they often can be utilized more efficiently. That is; for example, multiple small arrays can be interconnected so that fewer memory array bit locations are left unused during communications or networking applications.

These and other features and advantages of the invention will be understood from the following detailed description of the invention in conjunction with the drawings.

DETAILED DESCRIPTION OF THE PREFERRED EMBODIMENTS

The present invention comprises a novel programmable logic array integrated circuit with distributed random access memory. The following description is presented to enable any person skilled in the art to make and use the invention. Descriptions of specific applications are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

The present invention shall be explained in terms of its application to programmable logic array integrated circuits of the kind shown in commonly assigned U.S. Pat. No. 5,550,782, which is hereby incorporated by reference herein, although the invention can be practiced in the context of other types of programmable logic array circuits. Various components of the preferred embodiment are described in block diagram form so as to avoid obscuring important features of the invention in the details. This block diagram portrayal of the preferred embodiment is intended to describe the best mode of practicing the invention in sufficient detail to permit a person of ordinary skill in the art to make and use the invention.

Briefly stated, the present invention involves the distribution of numerous small blocks of dedicated random access memory (RAM) throughout a programmable logic array integrated circuit. These small blocks can be programmably combined to build shallow, wide FIFOs/RAM arrays which are commonly used in networking and communications applications, for example. The provision of these relatively small blocks of dedicated memory, in accordance with the invention, rather than the provision of larger blocks of dedicated memory can help to avoid wasting valuable space occupied by unused portions of such larger blocks. Moreover, the provision of smaller blocks of dedicated RAM, in accordance with the invention, rather than the programming look up tables (LUTs) to provide such RAM blocks, can help to avoid the consumption of valuable programmable resources, i.e., LUTs, to produce the RAM blocks.

Figure 1:
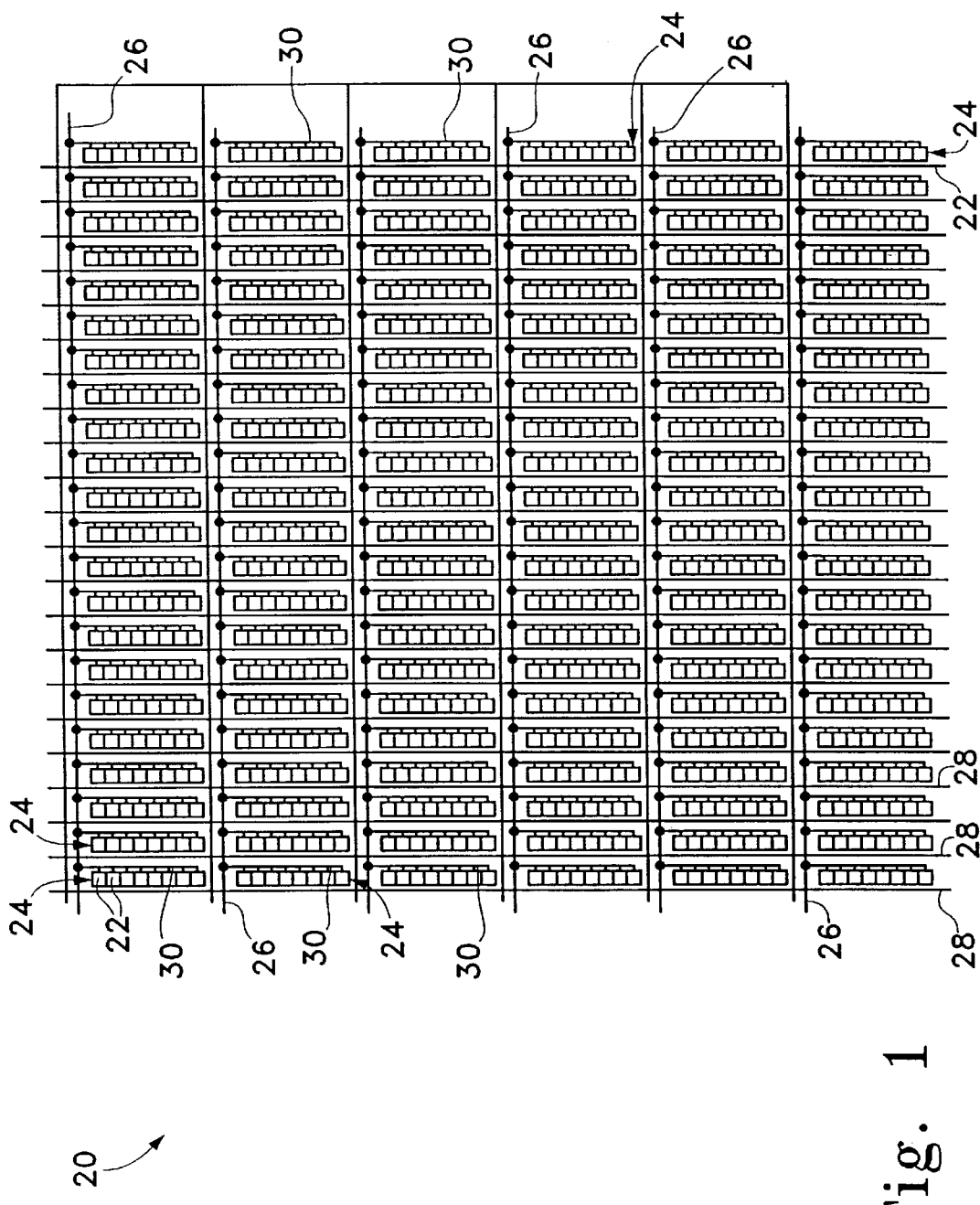
FIG. 1 is a simplified block diagram of a programmable logic array integrated circuit which includes an array of logic modules which may incorporate the present invention.
Figure 10:
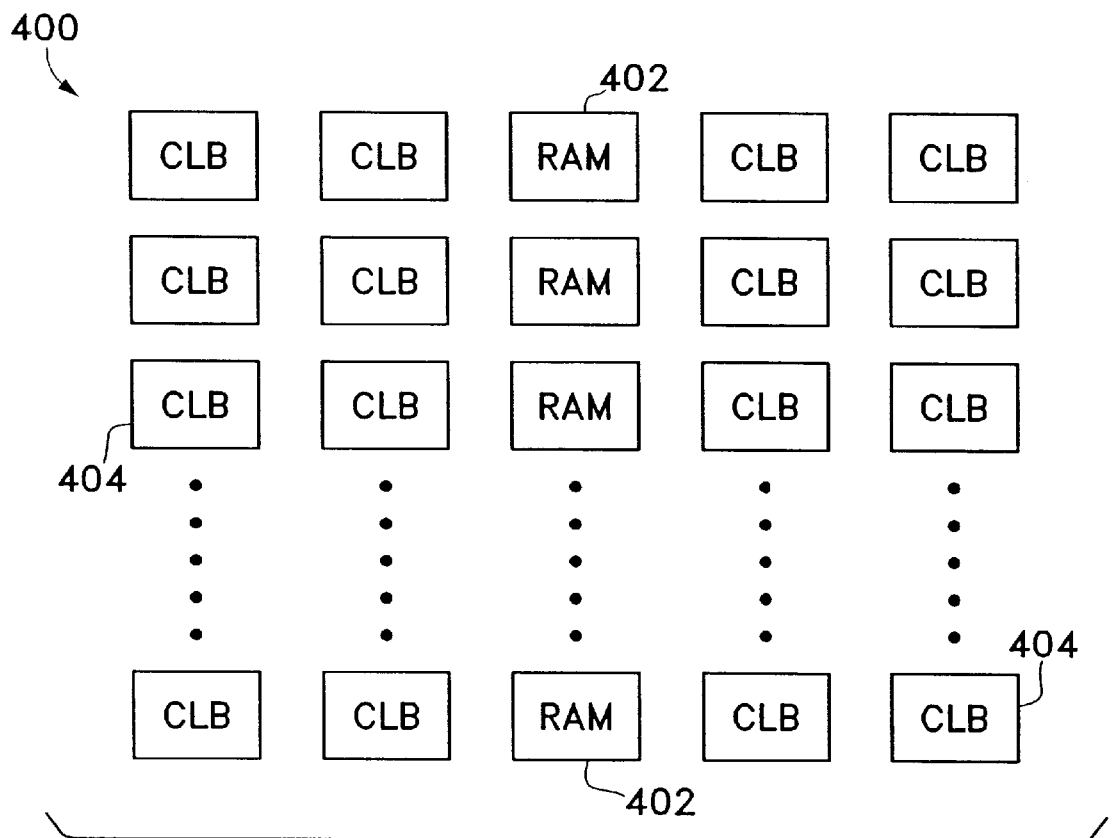
FIG. 10 is a very generalized block diagram of a PLD showing an array of RAM blocks and combinational logic blocks.

As shown in FIG. 1, which is substantially identical to FIG. 10 of U.S. Pat. No. 5,550,782 (the "'782 patent"), a programmable logic array integrated circuit 20 in accordance with a presently preferred embodiment of the invention has a large number of programmable logic elements 22 and dedicated RAM blocks (not shown in FIGS. 1–3). Each programmable logic element can perform a relatively simple logic function (e.g., form any logical combination of four inputs). In a present embodiment, groups of eight logic elements are combined with a dedicated RAM block (not shown in FIGS. 1–3) in a programmable logic module (also referred to as a logic array block, or LAB 24). LABs 24 are arranged in the circuit 20 in a two dimensional array of columns and rows. In one embodiment, the array of LABs comprises six rows of twenty-two LABs per row (or twenty-two columns of six LABs per column).

A group of global horizontal conductors 26 is associated with each row of LABs 24. A group of global vertical conductors 28 is associated with each column of LABs 24. A group of local vertical interface conductors 30 is associated with each LAB 24. A signal on any of the horizontal conductors 26 can be programmably applied (via local interface conductors 30) to one or more logic elements 22 in the LAB row associated with that conductor. The output signal of each logic element 22 can be programmably applied to a global horizontal conductor 26 associated with that element's LAB row, and also to one or two global vertical conductors 28 associated with that element's LAB column. The output of each logic element 22 can also be programmably applied to other logic elements in that element's LAB via local feedback conductors 54, shown in FIG. 2 which is similar to FIG. 11 of the '782 patent. The global vertical conductors 28 are programmably connectable to the global horizontal conductors 26.

The conductors and connections described above comprise the general interconnection circuitry of the programmable logic array integrated circuit 20 of the presently preferred embodiment of the invention. This general interconnection circuitry permits any logic module (LAB) output to be connected to virtually any logic module input so that the circuit 20 can be programmed to perform large numbers of logic functions of almost any desire complexity.

Figure 2:
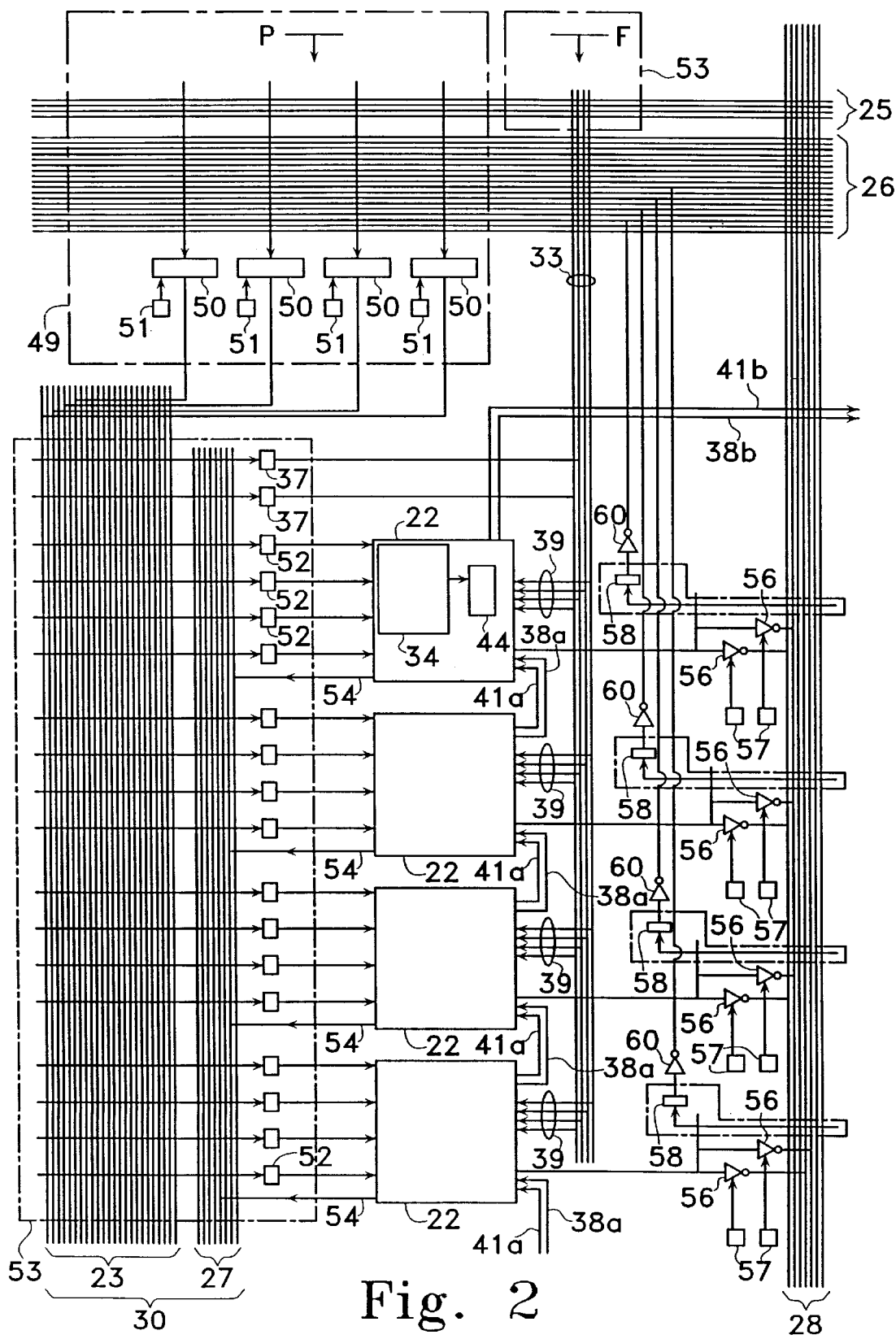
FIG. 2 is another more detailed schematic block diagram of a portion of one illustrative programmable logic module of the circuit shown in FIG. 1.

Turning now to FIG. 2 (which is substantially identical to FIG. 11 of the '782 Patent), there is shown a portion of one possible implementation of a typical programmable logic module or LAB 24 on circuit 20. Four representative programmable logic elements 22 are shown out of a total of eight logic elements plus one RAM block that comprise a typical LAB. The RAM block portion of the LAB is not shown in FIG. 2, but is shown in FIGS. 4–6 and 9. Although logic elements 22 can be implemented in other ways (e.g., as product-term based macrocells), each logic element 22 includes a look up table or universal logic block ("ULB") 34 and a flip-flop type device 44. Each look up table 34 is basically a circuit which can be programmed to produce an output signal which is any logical function of four input signals applied to the look up table. Each flip-flop 44 is a circuit which can be programmed either to store or to simply pass through the output signal of the associated look up table. Alternatively, device 44 could be a flip-flop with no pass through or bypass capability.

In addition to the above-described representative logic elements, FIG. 2 shows portions of representative global horizontal conductors 26, global vertical conductors 28, LAB local interface conductors 30, and universal fast conductors 25. Each of the LAB local interface conductors 30 include local input conductors 23 and local LAB conductors 27 and local vertical clock and clear conductors 33. The LAB input conductors 23 can be connected to a selected one (or more) of conductors 26 and 28 via a programmably controlled programmable logic connector ("PLC") 50 (only some of which are shown in FIG. 2). PLCs 50 can be implemented in any of a wide variety of ways. For example, each PLC 50 can be a relatively simple programmable connector such as a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic implementing functions such as AND, NAND, OR, or NOR. Examples of components suitable for implementing PLCs 50 are EPROMs, EEPROMs, pass transistors, transmission gates, antifuses, laser fuses, metal optional links, etc. The components of PLCs 50 can be controlled by various function control elements 51 ("FCEs") as described in more detail below (although with certain PLC implementations (e.g., fuses and metal optional links) separate FCE devices are not required, so that in those cases the depiction of FCE devices in the accompanying drawings merely indicates that the PLCs are programmable).

In the depicted, presently preferred embodiment each PLC 50 includes a 15-to-1 switch which is controlled by programmable function control elements ("FCEs") 51 on circuit 20 to connect one of its fifteen inputs to its output. Each of the fifteen inputs is the signal on a predetermined respective one of conductors 25 or 26. There is one PLC 50 for each of the twenty four LAB input conductors 23. Each of conductors 25 and 26 is connected to two of PLCs 50. Accordingly, each of conductors 25 and 26 is connectable to two of conductors 23. The letter P and the associated arrow symbol inside dotted line 49 indicate that the population of connections from conductors 25 and 26 to the inputs of each of PLCs 50 is a partial population.

FCEs 51 can also be implemented in any of several different ways. For example, FCEs 51 can be SRAMs, DRAMs, first-in first-out ("FIFO") memories, EPROMs, EEPROMS, function control registers (e.g., as in Wahlstrom U.S. Pat. No. 3,473,160), ferro-electric memories, fuses, antifuses, or the like.

Each of the four data inputs to each logic element 22 can be connected to any one (or more) of LAB input conductors 23 (and/or) any one (or more) of local conductors 27 via a PLC 52. PLCs 52 may have any of the characteristics described above for the general case of PLCs 50. However, in the depicted, presently preferred embodiment each of PLCs 52 (and each similar PLC 37) is a 32-to-1 switch so that any one of the LAB input conductors 23 or any one of the eight local conductors 27 can be connected to each LAB data input. Accordingly, the letter F and the associated arrow symbol inside chain dotted line 53 indicate that the population of connections from conductors 23 and 27 to PLCs 37 and 52 is a fill population. To avoid overcrowding the drawing, the FCEs (similar to above-described FCEs 51) for programmably controlling PLCs 37 and 52 are not shown separately, but rather are assumed to be part of elements 37 and 52.

The data output of the flip-flop 44 in each logic element 22 can be applied (via feedback conductor 54) to a respective one of local conductors 27. These conductors serve only the logic modules in the associated logic module or LAB 24. In other words, conductors 27 do not extend beyond the associated LAB. The data output of the flip-flop 44 in each logic element 22 can also be applied to either or both of two global vertical conductors 28 (via tri-state drivers 56 which form a further portion of the LAB local interface), and to one of global horizontal conductors 26 (via PLC 58 and tri-state driver 60 which form a further portion of the LAB local interface). The other input or inputs to each PLC 58 are the signals from one or more of global vertical conductors 28. Accordingly, global vertical conductors 28 are selectively connectable to global horizontal conductors 26 via PLCs 58 and tri-state drivers 60. PLCs 58 may be similar to any of the above-described PLCs. The use of tri-state drivers 56 and 60 is advantageous to strengthen signals which may be required to travel relatively long distances throughout circuit 20 and/or which may be inputs to relatively large numbers of other components.

In addition to being available as data inputs to logic elements 22, the signals on any of conductors 23 and 27 can also or alternatively be applied to any of local vertical conductors 33 via PLCs 37. In the depicted, presently preferred embodiment, each of PLCs 37 is a 32-to-1 switch, but PLCs 37 can alternatively have any of the characteristics described above for the general case of PLCs 50. Although only two PLCs 37 are shown in FIG. 2, there is preferably one such PLC for each of the four conductors 33. Each of conductors 33 is connectable to any one of universal fast conductors 25 for receiving the signal on the fast conductor. These connections from conductors 25 to conductors 33 are preferably made in the same way that the connections from conductors 25 and 27 to conductors 33 are made, i.e., by PLCs controlled by FCEs (all represented by element 53 in FIG. 2). Again, although each of these PLCs can have any of the characteristics described above for the general case of PLCs 50, in the depicted, presently preferred embodiment each of these PLCs can connect any of conductors 25 to an associated one of conductors 33. The letter F and the arrow symbol inside chain dotted line 53 indicate that the population of possible connections from conductors 25 to each of conductors 33 is a full population. Each of conductors 33 is connectable (via conductors 39) to each logic elements 22. FCE-controlled PLCs in each logic module allow these signals to be used for such purposes as flip-flop clock and flip-flop clear. Thus local vertical conductors 33 are known as clock and clear lines and can be driven from fast lines 25 for synchronous clocks and clears (i.e., clocks and clears which come from outside of circuit 20 and are available everywhere throughout circuit 20), or from LAB input lines 23 or local lines 27.

There are two other types of local interface interconnections shown in FIG. 2 which require discussion. The first of these is carry chain interconnection represented in part by conductors 38a and 38b. These interconnections allow a carry out output of each logic element 22 to be used as a carry in input to an adjacent or nearby logic element. For example, carry chain conductors 38a allow the carry out output of each logic element 22 shown in FIG. 2 to be the carry in input to the next higher logic element in that Figure. Similarly, carry chain conductor 38b runs from the top-most logic element 22 in the LAB fragment shown in FIG. 2 to the bottom-most logic module in the horizontally adjacent LAB in the adjacent column of LABs. This allows the carry chain to continue from LAB to LAB if desired.

The other type of local interface interconnection remaining to be discussed is illustrated by representative conductors 41a and 41b in FIG. 2. These conductors are called cascade connect conductors. They allow the data outputs of adjacent or nearby logic elements 22 to be logically combined, if desired, to perform more complex logic functions without the need to pass intermediate data through the general interconnection network. The manner in which cascade connect conductors are employed in the logic modules is shown in detail in FIG. 3.

Figure 3:
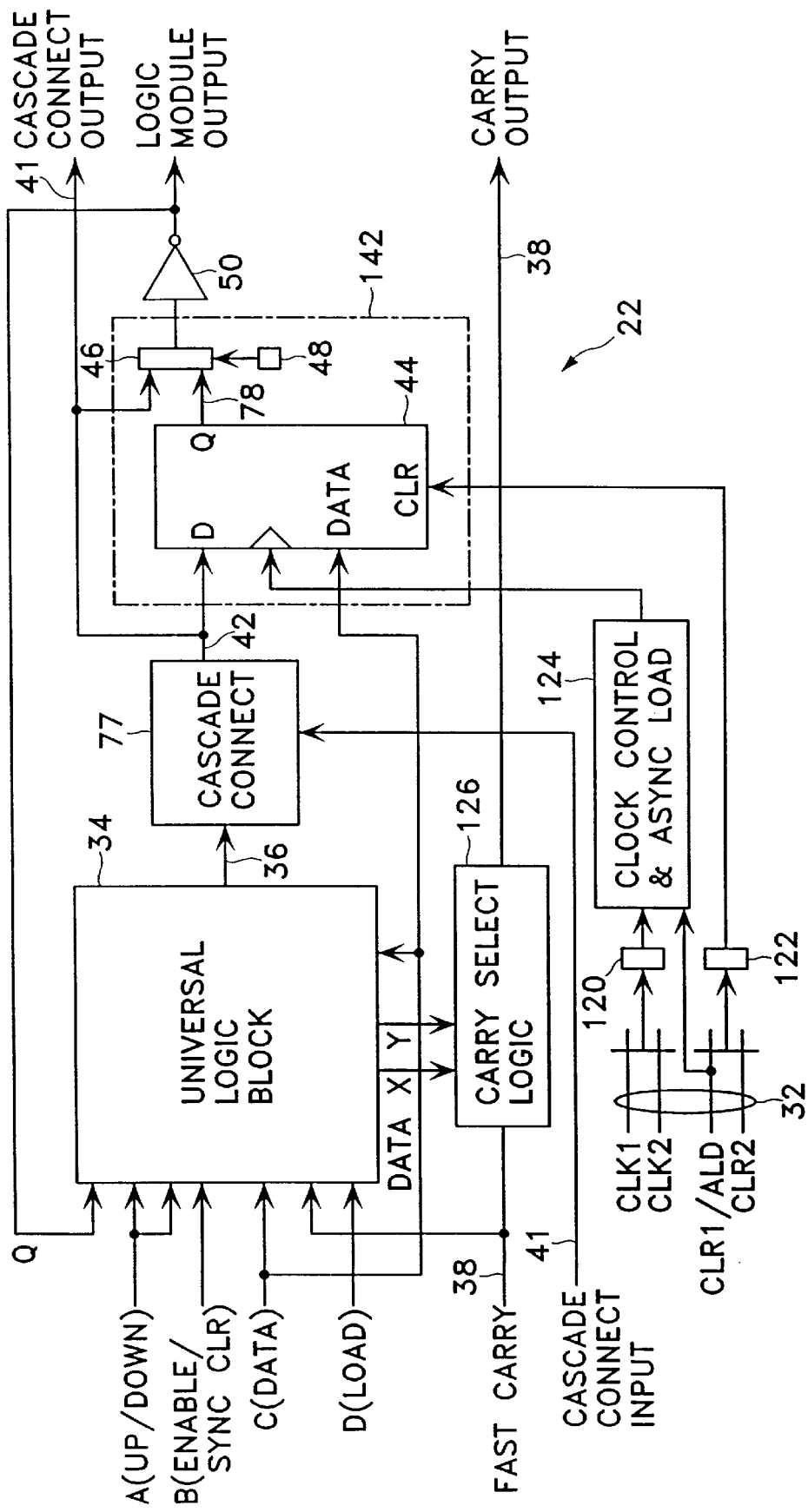
FIG. 3 is an even more detailed schematic block diagram of an illustrative programmable logic element of the logic module of FIG. 3.

Referring to the illustrative drawing of FIG. 3 (which is substantially identical to FIG. 17 of the '782 patent), there is shown a more detailed schematic block diagram of a representative logic element 22 of the circuit 20. As explained in the '782 patent, a universal logic block 34 is programmable to produce on lead 36 an output signal which is one of several possible logical functions (preferably any possible logic function) of input signals A–D. To facilitate performing addition, subtraction and/or counting, universal logic block 34 may be programmable to produce one of several possible logical finctions of certain of inputs A–D and inputs Q and/or "fast carry". Universal logic block 34 can be implemented in any of several ways, for example, as a look up table (LUT) or product-term-based macrocell. Details of several possible implementations of universal logic block 34 are provided in the '782 patent.

Output lead 36 is one input to cascade connect logic element 39. The other input to cascade connect logic element 39 is a cascade connect output from another, preferably adjacent, logic element. See FIG. 2 which shows representative cascade connections 38 between adjacent logic elements 22 within a single LAB 24. Also, see cascade connections 41a between logic elements 22 in adjacent LABs 24. Assuming that the cascade connect input 41 is active, logic element 22 combines it with the signal on lead 36 and applies the resulting output signal on lead 42 to the D input of flip-flop 44. The Q output signal of the flip-flop 44 is one input to switch 46. The signal on lead 42 is the other input to switch 46.

Switch 46 is controlled by a conventional programmable function control element ("FCE") 48 which programmably connects the desired one of its two inputs to its output. Accordingly, either a registered signal or an unregistered signal appears at the switch output depending on the state of the FCE 48. In this way, the output signal of cascade connect logic element 77 is passed by switch 46 either as registered by flip-flop 44 or as unregistered by that flip-flop 44.

The output of switch 46 is inverted by inverter 50 and thereby becomes the output signal of that logic element 22. The signal on lead 42 is also applied via cascade connection lead 41 to the cascade connection input of another, preferably adjacent, logic element 22. Accordingly, any number of logic elements 22 can be connected in series via cascade connection leads to produce a logic function of considerable complexity.

Other circuitry in FIGS. 1–3 is not part of the present invention and therefore need not be explained herein. These other elements are described in the '782 patent.

Figure 4:
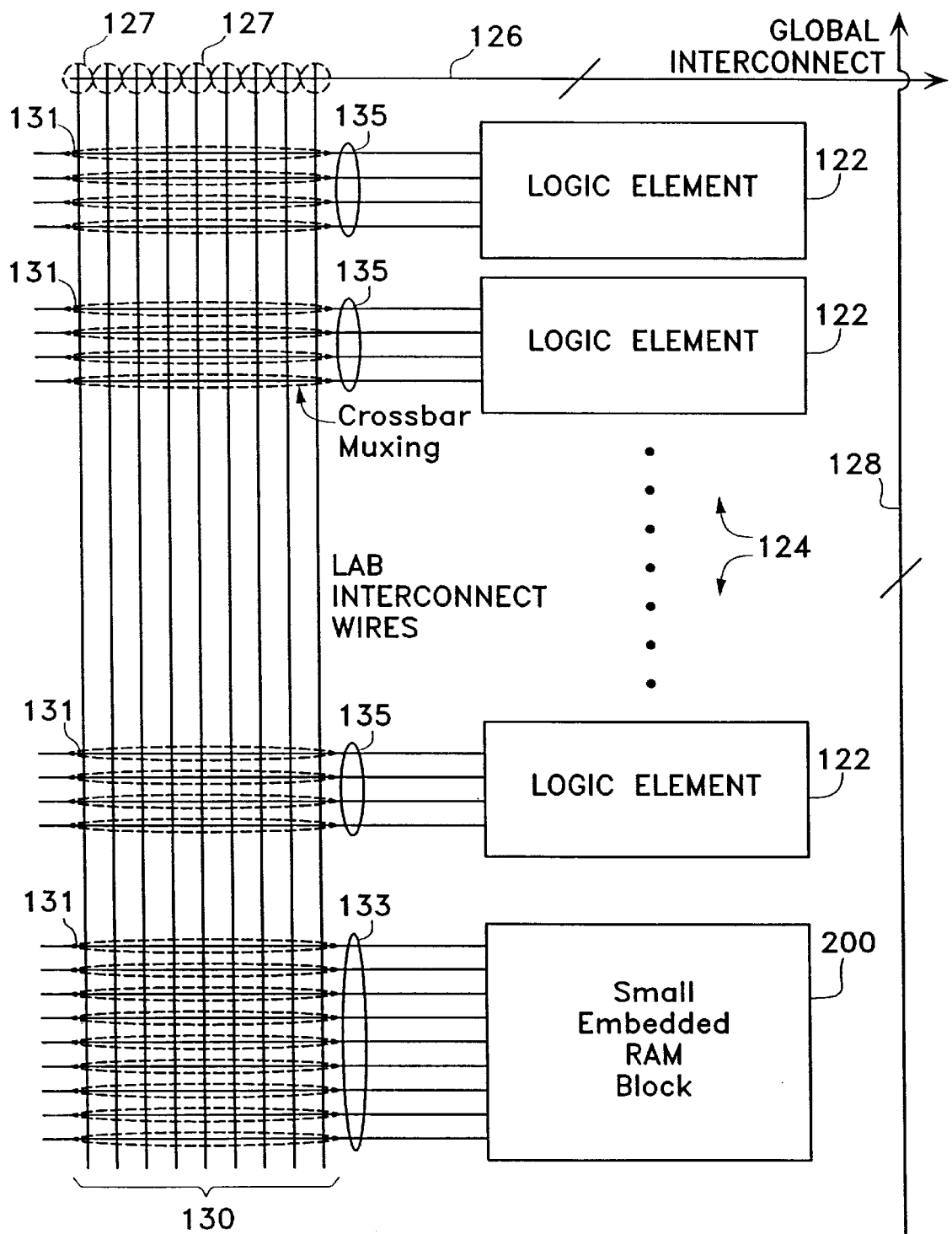
FIG. 4 is a generalized block diagram of a portion of a programmable logic module of a programmable logic array integrated circuit like that in FIG. 1 which includes a small dedicated RAM block in accordance with a first presently preferred embodiment of the invention.

Referring to the illustrative drawings of FIG. 4, there are shown details of a portion of a programmable logic module 124 which include a RAM block 200 in accordance with a first presently preferred embodiment of the invention. It will be appreciated that this programmable logic array module is but one of the numerous modules of a programmable array logic integrated circuit of the general type shown in FIG. 1. The programmable logic module or LAB 124 includes multiple programmable logic elements 122 (only three out of eight are shown) of the general type described in FIG. 3, for example. The logic module 124 also includes RAM block 200. The RAM block 200 is dedicated primarily to the storage of user information such as communications data or instructions transferred dynamically to or from such block during actual operation of the integrated circuit. There is no need to program such dedicated RAM block 200 to serve this role, although local interface circuitry and the global interconnect network must be programmed to connect the RAM block 200 to other circuitry as required by the particular application or use.

More specifically, programmable local interface conductors 130 can programmably interconnect the programmable logic elements 122 and the RAM block 200 with each other and/or with global horizontal conductors 126 and/or with a global vertical conductors 128. Programmable interconnections between the local interface conductors 130 and the logic elements 122 and/or RAM block 200 are accomplished through programmable switching indicated by the dashed lines 131. Programmable interconnections between the local interface conductors 130 and the global horizontal conductors 126 are accomplished through programmable switching indicated by the dashed lines 127.

A dedicated RAM block 200 is incorporated into the logic module 124 together with the other logic elements 122 of that module 124, and it shares local interface conductors 130 with those elements 122. While the logic elements 122 all are individually programmable to perform different logical functions, the RAM block 200 is primarily dedicated to serving as a random access memory. Since the RAM block is relatively small, only 8 bits in a presently contemplated embodiment, it does not occupy a significant amount of chip area, and it is more likely that all of its storage locations will be used if the block is put to use in networking or communications applications. Also, since the RAM block 200 is dedicated to serving as a memory, it is not necessary to consume programmable resources, such as look up tables (LUTs), to produce the RAM block 200.

It will be appreciated that the drawings of FIG. 4 are greatly simplified in order to highlight novel features of the presently preferred embodiment of the invention and to avoid obscuring important features of the invention in the details. However, important details are discussed above with reference to FIGS. 1–3. For example, further details of the local interface conductors 130 will be appreciated from the above discussion of the local input conductors 23 and the local LAB conductors 27 and the vertical clock and clear conductors 33 and drivers 56 and 60 and the carry chain. Details of the global horizontal conductors 126, for instance, will be appreciated from the above discussion of the universal fast conductors 25 and the global horizontal conductors 26. Details of the global vertical conductors 128, for example, will be appreciated from the above discussion of the global vertical conductors 28. Details of the individual logic elements 122 and their interconnections with other components of the circuit 20 will be appreciated from the above discussion of FIGS. 2 and 3. Although certain details of the embodiment of FIG. 4 are omitted from that figure, such as the programmable switching between the global horizontal and the global vertical conductors 126 and 128, for instance, one skilled in the art will readily appreciate their implementation from the other drawings.

Figure 5:
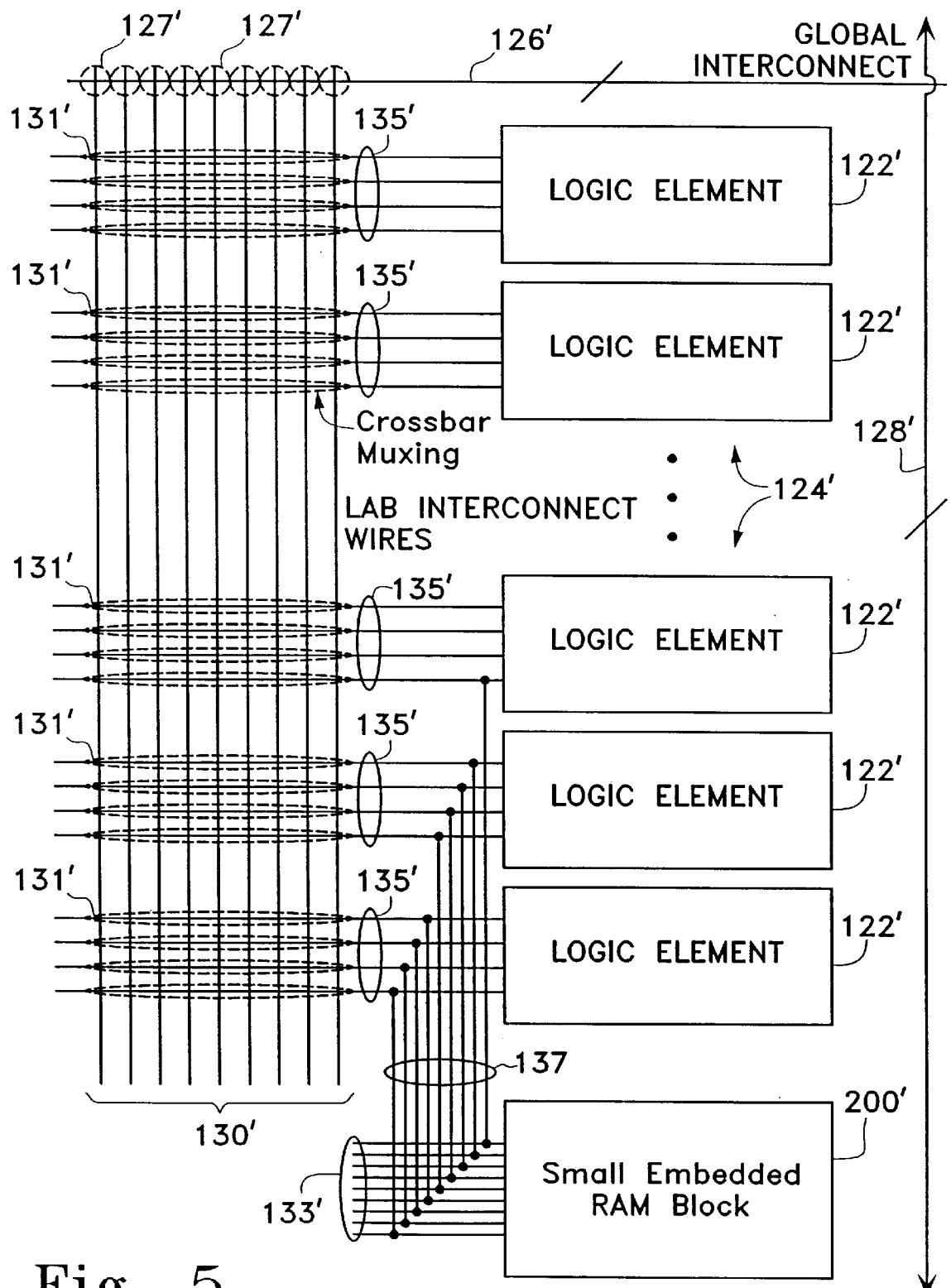
FIG. 5 is a generalized block diagram of a portion of a programmable logic module of a programmable logic array integrated circuit like that in FIG. 1 which includes a small dedicated RAM block in accordance with a second presently preferred embodiment of the invention.

Referring now to the illustrative drawings of FIG. 5, there is shown a greatly simplified block diagram of a portion of a programmable logic module 124' in accordance with a second presently preferred embodiment of the invention. Components of the second embodiment in FIG. 5 that are substantially identical to corresponding components of the first embodiment in FIG. 4 are identified by primed reference numerals identical to the numerals referencing the same components in FIG. 4. Basically, the difference between the first embodiment in FIG. 4 and the second embodiment in FIG. 5 is that, in the second embodiment, the RAM block input leads 133' are connected to the logic element input leads 135' which, in turn, can be programmably connected to the local interface conductors 130'. Whereas in the first embodiment in FIG. 4, the RAM block input leads 133 can be programmably connected directly to the local interface conductors 130. More specifically, in the second embodiment, the individual input leads 133' of RAM block 200' are permanently connected to individual logic element input leads 135'. The second embodiment of FIG. 5 advantageously uses less die area than the first embodiment of FIG. 4 since fewer additional interconnect wires are required to support the RAM block 200' in the second embodiment. However, this savings in die area comes at a cost of a loss of some programmable logic element availability whenever the RAM block 200' is used The implementation of embedded RAM blocks 200 or 200' within programmable logic modules 124 or 124' facilitates the distribution of RAM blocks throughout the programmable logic array integrated circuit 20. It will be appreciated that, consistent with the invention, the circuit 20 can be implemented with each and every programmable logic module (or LAB) having its own dedicated RAM block, or alternatively, with only some subset of the total number of logic modules having their own dedicated RAM blocks. These distributed dedicated RAM blocks can be programmably interconnected in a manner that will be readily understood to those skilled in the art using the interconnection resources described above (i.e. horizontal and vertical global interconnections and local interface interconnections), to combine the distributed dedicated RAM blocks into bigger RAM blocks of a desired depth and width. Note that the dedicated RAM blocks can be used as FIFO or ROM, and when not used as dynamic memory, can be employed as look up tables useful for logic functions.

Figure 6:
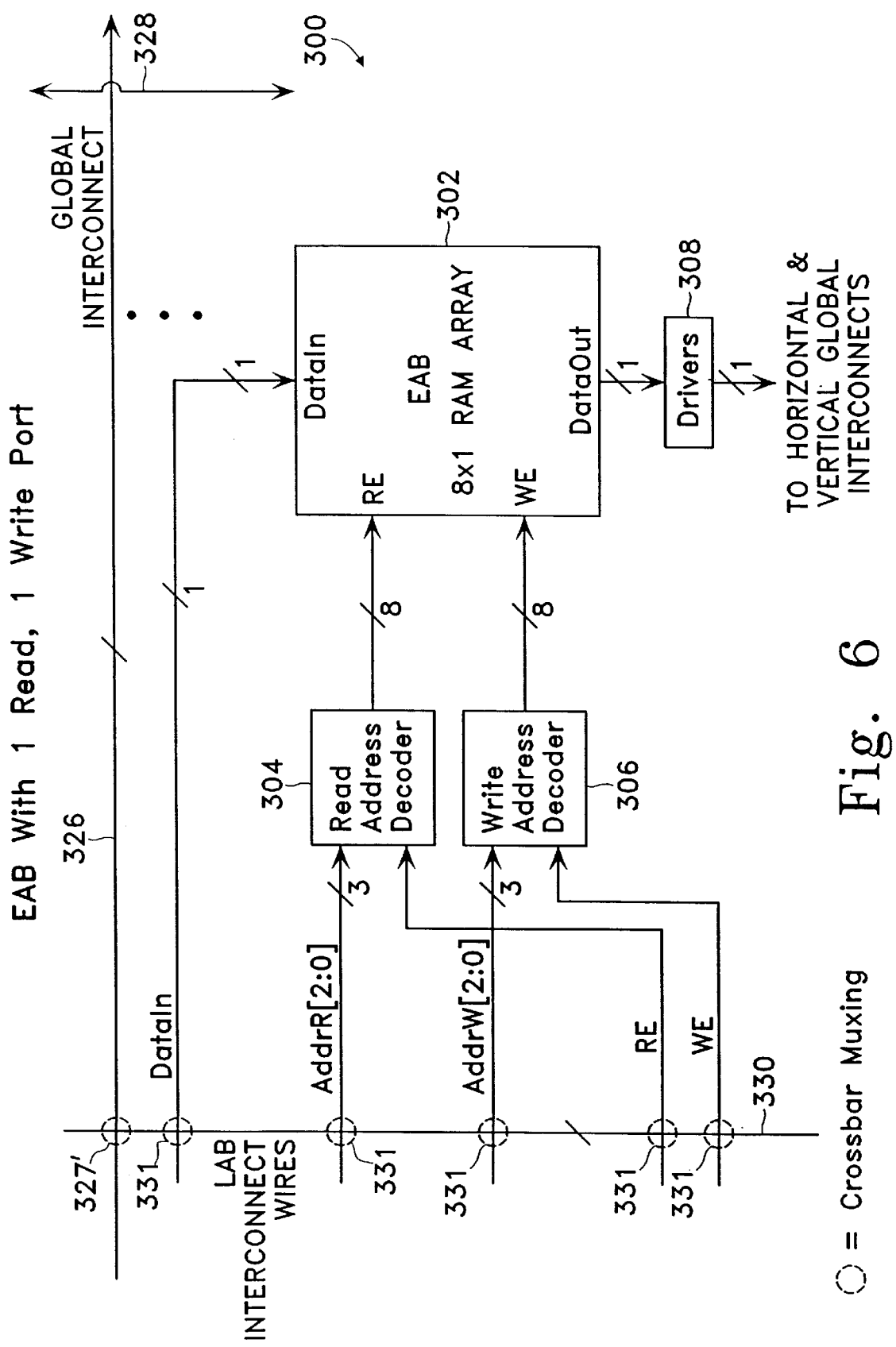
FIG. 6 is a more detailed schematic block diagram of the small dedicated RAM block of FIGS. 4 and 5.

FIG. 6 is an illustrative schematic block diagram that shows additional details of a presently preferred embodiment of a dedicated RAM block 200 suitable for use in the first embodiment of FIG. 4. Although the following description refers to the first embodiment in FIG. 4, it will appreciate that the same RAM block can be used in the second embodiment in FIG. 5. The RAM block 200 includes an 8×1 RAM array 302 and corresponding memory access control circuitry. In a present embodiment, the memory access control circuitry includes a READ Address decoder 304, a WRITE Address decoder 306. The RAM array 302 can store eight rows and one column of data, i.e. 8 bits. The READ Address decoder 304 receives a RE control signal and decodes three bits of address data AddR[2:0] on lines 133 to produce an eight bit address which is provided to the RE input of the RAM array 302. The WRITE Address decoder 306 receives a WE control signal and decodes three bits of write address data AddW[2:0] on lines 133 to produce an eight bit write address which is provided to the WE input of the RAM array 302. The Output driver circuitry 308 receives stored data from DataOut terminal of the RAM array 302, and provides it to one or more of the interconnection resources described above. The DataIn terminal of the RAM array 302 receives input from the interconnection resources described above.

The drawings of FIG. 6 have been greatly simplified. However, it will be appreciated that programmable switches 131, as described above, can be used to programmably interconnect the various address signal and control lines of the RAM block 302 with the local interface conductors 130. Moreover programmable switches 127, as described above, can be used to programmably interconnect the local interface conductors to the global horizontal conductors 126. Other programmable switches (not shown) can be used to programmably connect the global vertical and horizontal conductors 126 and 128.

The RAM block 200 is a dedicated circuit. The decode logic is permanently fixed in the circuit. Consequently, the decode logic can be built to operate faster since it need not serve other general purpose logic functions. Moreover, the stored output is provided directly to the interconnection resources, which will be understood from FIGS. 1–3, via the output driver circuitry 308. This can result in faster RAM since there is no need for the stored output to traverse an extra level of multiplex logic as is often the case when a RAM block is produced from a look up table.

Figure 7:
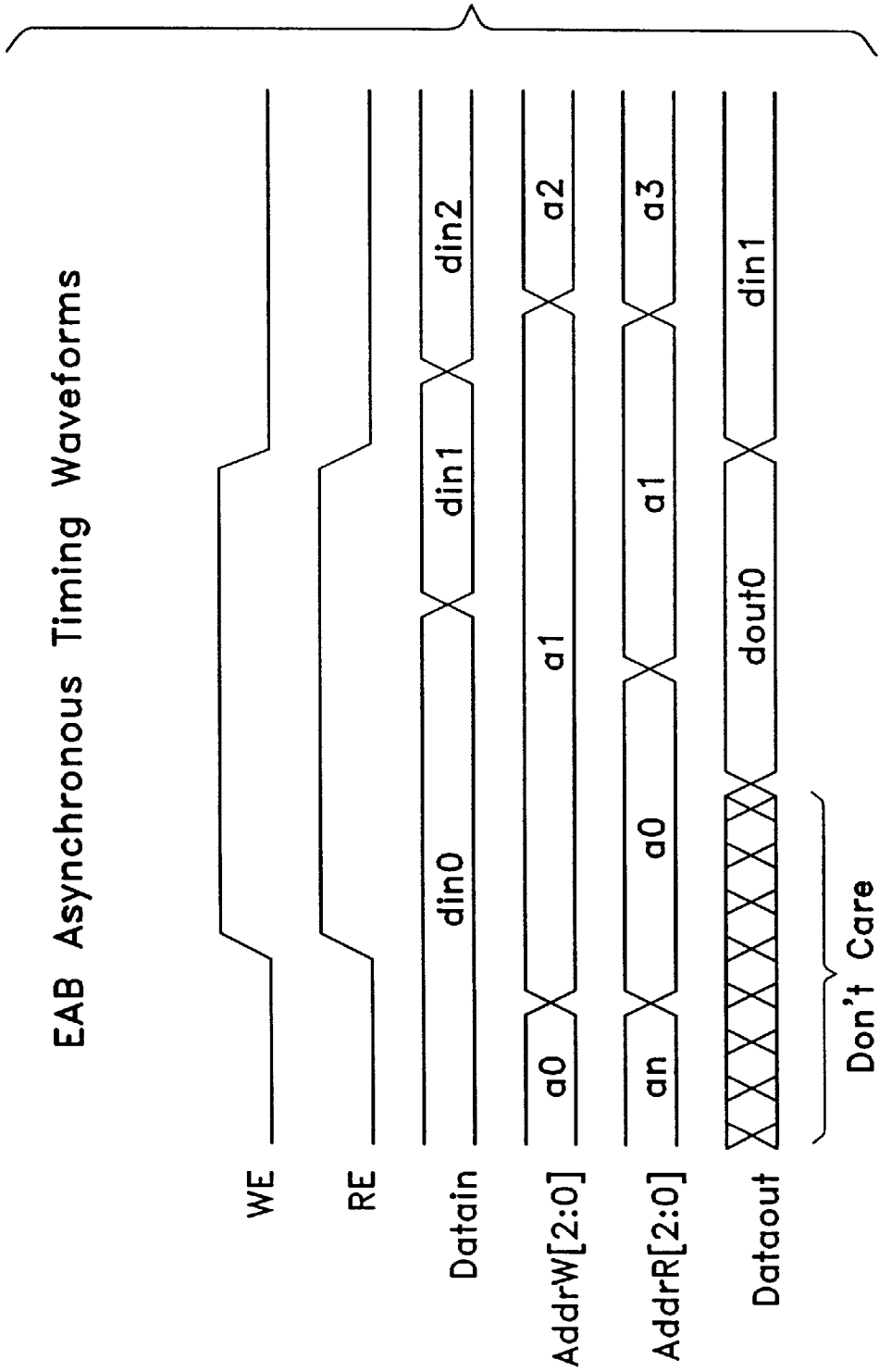
FIG. 7 are illustrative asynchronous timing wave forms representing one possible mode of operation of the RAM block of FIG. 6.
Figure 8:
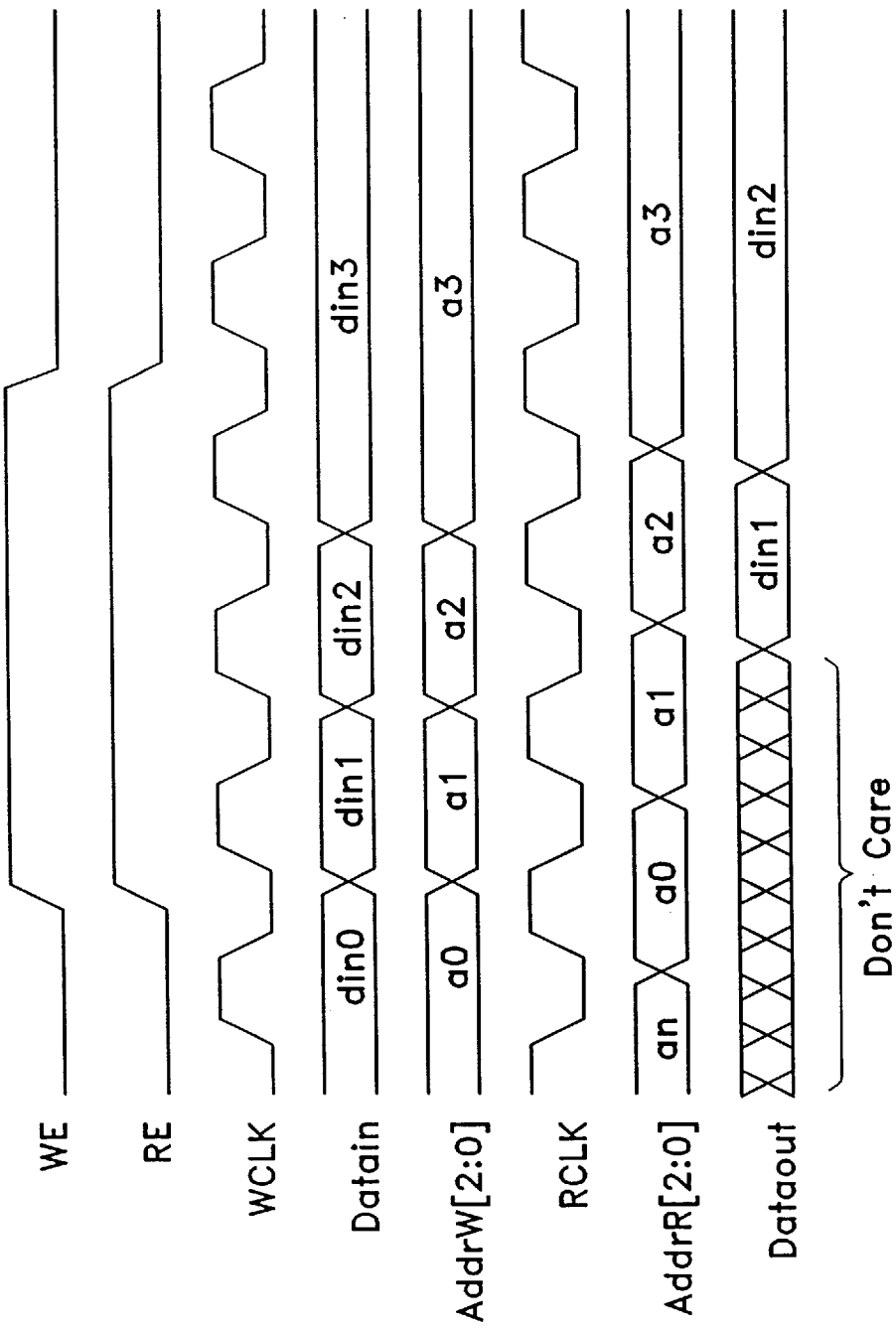
FIG. 8 are illustrative synchronous timing waveforms representing another possible mode of operation of the RAM block of FIG. 6.

The RAM block 200 of FIG. 6 can be implemented in accordance with the invention to operate with asynchronous timing waveforms, or alternatively, to operate with synchronous timing waveforms. The illustrative timing diagram of FIG. 7 depicts the operation of the RAM block 200 of FIG. 6 when that block is implemented to operate in connection with asynchronous (or level sensitive) read and write waveforms. The illustrative timing diagram of FIG. 8 depicts the operation of the RAM block 200 of FIG. 6 when that block is implemented to operate in connection with synchronous (edge-triggered) read and write waveforms. The main difference between level sensitive and edge-triggered being the absence of a clock in the former. The use of synchronous timing waveforms eases the timing requirements since address and datain are referenced to a clock edge which is usually a well-defined part of a system.

Referring to FIG. 7, there is shown the process of simultaneous asynchronous read and write cycles which is the typical FIFO mode of operation for the RAM block 200. Of course, independent read and write cycles are possible as well. Write address (AddrW[2:0])a1 should be valid before WE goes high and must change only after WE goes low, signaling the end of the write cycle. AddrW[2:0] should not change when WE is high. The DATAIN din1 which is written at location a1 should satisfy setup and hold timings with respect to the falling edge of the WE pulse. RE is active high in order to read the RAM block storage locations. The addresses of storage locations to be read are supplied on the AddrR[2:0] signal. FIG. 7 also illustrates the process of reading of dout0 (since din0 was never written) at location a0 and reading of din1 (this was just written) at location a1.

Referring to FIG. 8, there is shown the process of synchronous reading and writing. It will be appreciated that although simultaneous reading and writing are shown in FIG. 8, independent read and write cycles are possible. WCLK and RCLK are additional signals. WCLK is the write clock and RCLK is the read clock. FIG. 8 shows writing to locations a1 and a2 and then reading from these locations. Location a1 is written with contents din1 at the positive edge of WCLK. Location a2 is written with contents din2 at the next positive edge of WCLK. WE should be active high during writing. Locations a1 and a2 are read at the falling edge of RCLK. RE should be active high during reading. As per the FIG. 8, location a3 is written with datain din3 but is not read since RE deactivates.

During synchronous operation, the address, datain, dataout and control signals (RE and WE) may consume some flip-flop resources of logic elements that share the same logic module as the RAM block 200. More specifically, synchronous operation ordinarily requires registering of inputs and outputs. The flip-flops of other logic elements in the logic module may be employed to serve this register function. For instance, separate flip-flops from different logic elements in the same logic module with the RAM block 200 may be programmed to store address, datain, dataout and control signals during synchronous operation. These flip-flops, for example, send information to the block 200 (e.g. datain, control) or receive information from the block (e.g., dataout) in response to clock signals. Nevertheless, the look up table (LUT) within a logic element whose flip-flop is used to register RAM information may still be available to perform other general purpose logic. This can provide an advantage over the current art of converting logic (that is using LUTs) to produce RAM blocks.

Figure 9:
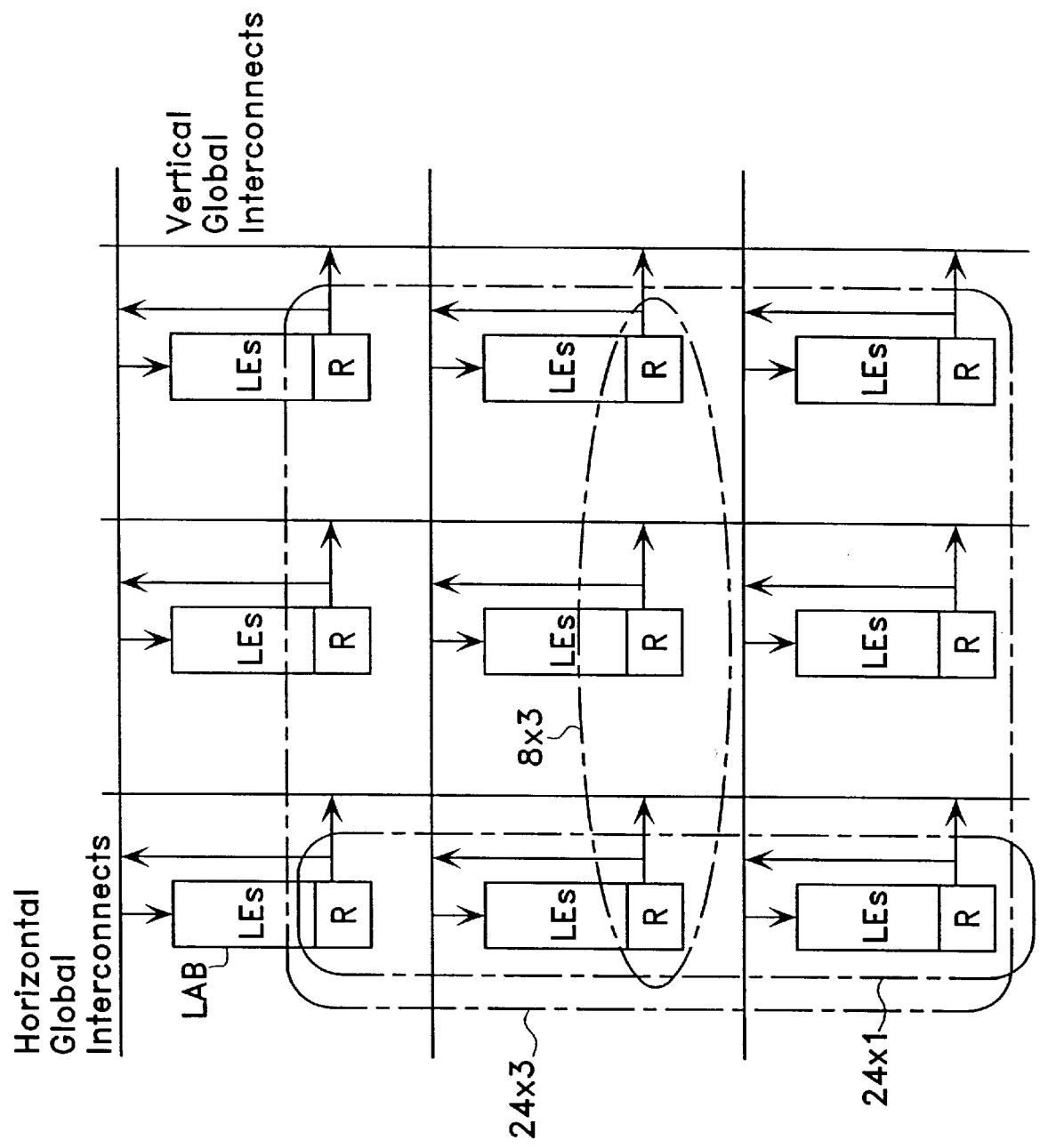
FIG. 9 is a generalized block diagram of a portion of the circuit of FIG. 1 which shows logic modules (LABs) that include logic elements (LE) and small embedded RAM blocks (R) that can be selectively programmed to produce RAM of different depths and different widths.

Referring to the illustrative drawings of FIG. 9, there is shown a generalized block diagram of a portion of the circuit of FIG. 1 in which each logic module or LAB includes logic elements (LE) and a RAM block (R). Each RAM block is 8 bits deep and 1 bit wide (8×1). The dotted lines 24×1 show three RAM blocks combined to form a 24×1 buffer. The dashed lines 24×3 show the combination of nine blocks to form a 24×3 buffer. The dashed lines 8×3 show the combination of three blocks to form an 8×3 buffer. Thus, buffers of varying depth and width can be formed from the small distributed RAM blocks of the present invention.

Referring to the illustrative drawings of FIG. 10, there is shown another even more generalized block diagram of a programmable logic device 400 within an array of RAM blocks 402 and programmable logic modules, also referred to as combinational logic blocks (CLBs), 404. The network of conductors interconnecting these RAM blocks 402 and CLBs 404 is omitted from FIG. 10, but will be understood from the discussion above. It will be appreciated that the PLD 400 can have small RAM blocks 404 distributed throughout the PLD 400.

Figure 11:
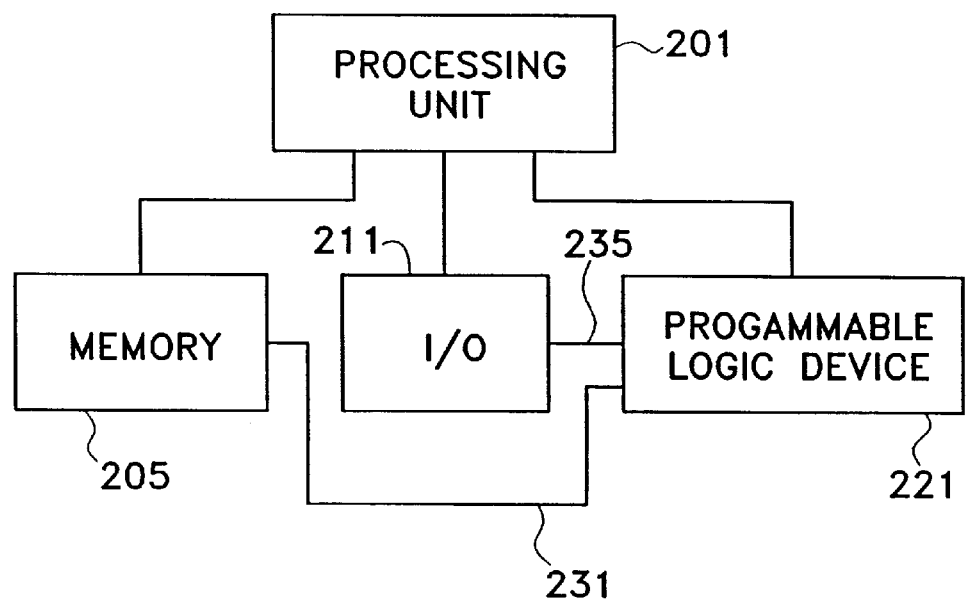
FIG. 11 is a block diagram of a digital system incorporating a programmable logic device integrated circuit.

Referring now to FIG. 11, there is shown a block diagram of a digital system within which the present invention may be embodied. In the particular embodiment of FIG. 11, a processing unit 201 is coupled to a memory 205, an I/O 211, and a programmable logic device (PLD) 221. PLD 221 is coupled to memory 205 through connection 231 and to I/O 211 through connection 235. The system may be a programmed digital computer system, digital signal processing system, specialized digital switching network, or other processing system. Moreover, the system may be a general purpose computer, a special purpose computer optimized for an application-specific task such as programming PLD 221, or a combination of a general purpose computer and auxiliary special purpose hardware.

Processing unit 201 may direct data to an appropriate system component for processing or storage, execute a program stored in memory 205 or input using I/O 211, or other similar function. Processing unit 201 may be a central processing unit (CPU), microprocessor, floating point coprocessor, graphics coprocessor, hardware controller, microcontroller, programmable logic device programmed for use as a controller, or other processing unit. In some embodiments, processing unit 201 may even be a computer system.

In one embodiment, source code may be stored in memory 205, compiled into machine language, and executed by processing unit 201. In the alternative, only the machine language representation of the source code, without the source code, may be stored in memory 205 for execution by processing unit 201. Memory 205 may be a random access memory (RAM), read only memory (ROM), fixed or flexible disk media, PC Card flash disk memory, tape, or any other storage retrieval means, or any combination of these storage retrieval means.

Processing unit 201 uses I/O 211 to provide an input and output path for user interaction. For example, a user may input logical functions to be programmed into programmable logic device 221. I/O 211 may be a keyboard, mouse, track ball, digitizing tablet, text or graphical display, touch screen, pen tablet, printer, or other input or output means, or any combination of these means. In one embodiment, I/O 211 includes a printer used for printing a hard copy of any processing unit 201 output. In particular, using I/O 211, a user may print a copy of a document prepared using a word processing program executed using processing unit 201. In other cases, a user may print out a copy of the source code or a listing of the logical functions contained within PLD 221.

PLD 221 may serve many different purposes within the system in FIG. 11. PLD 221 may be a logical building block of programmed digital computer 201, supporting its internal and external operations. PLD 221 is programmed to implement the logical functions necessary to carry on its particular role in system operation.

As some examples of the multitude of uses for PLD 221, programmed digital computer 201 may use PLD 221, through connection 231, to decode memory or port addresses for accessing memory 205 or I/O 211. PLD 221 may be programmed to store data like a memory or specialized memory, where this comes from processing unit 201 or memory 205 (via connection 231). PLD 221 may be used as a microcontroller for a memory 205 device such as a fixed or flexible disk drive. PLD 221 may also be configured to be a microcontroller for an I/O 211 device such as a keyboard or scanner, passing data through connection 235.

In other embodiments, PLD 221 may be used as a controller or specialized processing unit such as a coprocessor for performing mathematical or graphical calculations. For example, processing unit 201 would direct data to PLD 221; PLD 221 processes this data; then PLD 221 returns the results to processing unit 201. Furthermore, processing unit 201 may pass or direct a program stored in memory 205 or input using I/O 211 to PLD 221 for execution. These are some of multitude of uses of PLD 221 within a digital system. Also, a system such as the one shown in FIG. 11 may embody a plurality of PLDs 221, each performing different system functions.

The system shown in FIG. 11 may also be used for programming PLD 221 with a particular logic pattern. A computer program for designing functions into a PLD may be stored in memory 205 and executed using processing unit 201. Then, a design characteristic which is to be programmed into PLD 221 is input via I/O 211 and processed by processing unit 201. In the end, processing unit 201 transfers and programs the design characteristic into PLD 221.

In FIG. 11, processing unit 201 is shown directly coupled to PLD 221. However, in other embodiments, a PLD interface may be coupled between processing unit 201 and PLD 221. The PLD interface would provide the proper adapters or sockets for interfacing PLD 221 to processing unit 201. Moreover, the PLD interface would provide the proper voltages and electrical characteristics for coupling PLD 221 to processing unit 201.

While particular embodiments of the invention have been described in detail, various modifications to the preferred embodiments can be made without departing from the spirit and scope of the invention. Thus, the invention is limited only by the appended claims.

What is claimed is:

1. A programmable logic array integrated circuit comprising:
   a plurality of programmable logic modules arranged in a two dimensional array of columns and rows;
   wherein a plurality of the respective programmable logic modules include,
      multiple logic inputs;
      at least one logic output;
      at least one programmable logic element which produces at least one logic output signal from one or more logic input signals;
      at least one dedicated random access memory block which can be used for the storage of user information and which includes at least one memory input and at least one memory output; and
   a network of conductors for programmably connecting said at least one logic output of substantially any of the programmable logic modules to substantially any of the logic inputs or to substantially any of the memory inputs of substantially any other programmable logic module and for programmably connecting said at least one memory output of substantially any of the plurality of programmable logic modules to substantially any of the logic inputs or to substantially any of the memory inputs of substantially any other programmable logic module.

2. The integrated circuit of claim 1 wherein, respective programmable logic modules include respective memory control circuits respectively connected to control respective random access memory blocks.

3. The integrated circuit of claim 1 wherein the respective random access memory arrays respectively include at least eight single bit memory locations.

4. The integrated circuit of claim 1 wherein said plurality of the programmable logic elements include respective data storage elements.

5. The integrated circuit of claim 1 wherein, respective programmable logic modules include respective dedicated read and write address decoders respectively connected to control respective random access memory blocks.

6. The integrated circuit of claim 1 wherein the network of conductors includes:
   a plurality of respective local interface circuits which are disposed adjacent to respective programmable logic modules and which are programmable to form interconnections with respective adjacent programmable logic modules.

7. The integrated circuit of claim 1 wherein the network of conductors includes:
   a plurality of respective local interface circuits which are disposed adjacent to respective programmable logic modules and which include programmable elements which are programmable to form interconnections with respective adjacent programmable logic modules; and
   a first plurality of global conductors which traverse the integrated circuit in a first direction and a second plurality of global conductors which traverse the integrated circuit in a second direction and which include a plurality of programmable elements for programmably interconnecting respective first and second conductors with respective local interface circuits.

8. The integrated circuit of claim 1 wherein the network of conductors includes:
   a plurality of respective local interface circuits which are disposed adjacent to respective programmable logic modules and which include programmable elements which are programmable to form interconnections with respective adjacent programmable logic modules and wherein the respective interface circuits include carry chain conductors and cascade connect conductors.

9. The integrated circuit of claim 1,
   wherein respective programmable logic modules include multiple respective programmable logic elements; and
   wherein the network of conductors includes,
      a plurality of respective local interface circuits which are disposed adjacent to respective programmable logic modules and which include programmable elements which are programmable to form interconnections with respective adjacent programmable logic modules and wherein respective interface circuits include respective conductors that are programmable to interconnect respective programmable logic elements; and
      a first plurality of global conductors which traverse the integrated circuit in a first direction and a second plurality of global conductors which traverse the integrated circuit in a second direction and which include a plurality of programmable elements for programmably interconnecting respective first and second conductors with respective local interface circuits.

10. The integrated circuit of claim 1 wherein the at least one programmable logic element is programmable to temporarily store at least one logic signal and to then provide such temporarily stored logic signal to a dedicated random access memory array.

11. A programmable logic array integrated circuit comprising:
   a plurality of logic array blocks arranged in a two dimensional array of columns and rows;
   wherein a plurality of the respective programmable logic modules include, multiple respective programmable logic elements, each of which includes multiple logic inputs and at least one logic output, wherein respective logic elements are programmable to produce respective output signals which are respective logical functions of respective input signals received by said respective programmable logic elements;

a respective random access memory block which includes a respective memory array and corresponding respective memory access control circuitry;

a respective programmable local interface to the multiple programmable logic elements and to the random access memory array and corresponding control circuitry; and a programmable network of conductors for programmable connecting a respective local interface circuit of substantially any logic array block to a respective local interface of substantially any other logic array block.

12. The integrated circuit of claim 11 wherein at least one programmable logic element in each logic array block includes a respective data storage element.

13. The integrated circuit of claim 11 wherein respective memory access control circuitry includes respective address decoder circuitry.

a plurality of respective dedicated read and write address decoders respectively connected to control respective random access memory arrays.

14. The integrated circuit of claim 11 wherein respective programmable local interfaces include:

respective conductors and corresponding programmable elements for programmably interconnecting respective programmable logic elements and respective random access memory blocks with each other or with the programmable network of conductors.

15. The integrated circuit of claim 11 wherein the programmable network of conductors includes:

a first plurality of global conductors which traverse across substantially the entire integrated circuit in a first dimension and a second plurality of global conductors which traverse across substantially the entire integrated circuit in a second dimension; and a plurality of programmable elements for programmably interconnecting individual first and second global conductors;

wherein the first plurality of conductors and the second plurality of conductors are laid out in a grid pattern and respective logic array blocks are disposed adjacent to respective intersections of respective first and second global conductors in the grid.

16. The integrated circuit of claim 11 wherein:

respective programmable local interfaces include respective conductors and corresponding programmable elements for programmably interconnecting respective programmable logic elements and respective random access memory blocks with each other or with the programmable network of conductors; and the programmable network of conductors includes a first plurality of global conductors which traverse across the integrated circuit in a first dimension and a second plurality of global conductors which traverse across the integrated circuit in a second dimension and further includes a plurality of programmable elements for programmably interconnecting individual first and second global conductors, wherein the respective logic array blocks are disposed adjacent to respective intersections of respective first and second global conductors.

17. The integrated circuit of claim 11 wherein:

at least one programmable logic element in each logic array block includes a respective data storage element;

respective programmable local interfaces include respective conductors and corresponding programmable elements for programmably interconnecting respective programmable logic elements and respective random access memory blocks with each other or with the programmable network of conductors; and the programmable network of conductors includes a first plurality of global conductors which traverse across the integrated circuit in a first dimension and a second plurality of global conductors which traverse across the integrated circuit in a second dimension and further includes a plurality of programmable elements for programmably interconnecting individual first and second global conductors, wherein respective logic array blocks are disposed adjacent to respective intersections of respective first and second global conductors.

18. A programmable logic array integrated circuit comprising:

a multiplicity of respective programmable logic modules disposed on said circuit in a two-dimensional array, each of which includes multiple logic inputs and at least one logic output and at least one programmable logic element which produces at least one logic output signal from one or more logic input signals, each respective programmable logic module further including a respective random access memory array each of which includes at least one memory input and at least one memory output and which can be dedicated to dynamic storage of information and which are disposed on said circuit in the two-dimensional array;

a multiplicity of respective programmable local interface circuits which provide respective shared interfaces to respective programmable logic elements and to respective dedicated random access memory arrays and which are disposed on said circuit in the two-dimensional array; and a network of global connectors which includes a first plurality of conductors extending along a first dimension of the two-dimensional array and a second plurality of conductors extending along a second dimension of the two-dimensional array, wherein the global connectors are programmable to interconnect substantially any of the respective programmable local interface circuits.

19. The integrated circuit of claim 18, further including:

a multiplicity of respective memory access control circuits which respectively control access to respective random access memory arrays.

20. The integrated circuit of claim 18 wherein the network of global conductors includes a multiplicity of programmable elements for programmably interconnecting individual conductors in the network.

21. The integrated circuit of claim 18 wherein respective programmable logic elements include at least one data storage element.

22. A programmable logic array integrated circuit comprising:

a plurality of programmable logic modules arranged in a two dimensional array of columns and rows;

wherein a plurality of the respective programmable logic modules include, multiple logic inputs;

at least one logic output;

at least one programmable logic element which produces at least one logic output signal from one or more logic input signals, at least one respective dedicated random access memory array which includes at least one memory input and at least one memory output; and a network of conductors, for programmably connecting the at least one logic output of substantially any of the programmable logic modules to substantially any of the logic inputs of or to substantially any of the memory inputs of substantially any programmable logic module and for programmably connecting the at least one memory output of substantially any of the plurality of programmable logic modules to substantially any of the logic inputs or to substantially any of the memory inputs of substantially any programmable logic module.

23. The integrated circuit of claim 22 wherein a plurality of programmable logic elements include respective data storage elements.

24. The integrated circuit of claim 22 wherein, respective programmable logic modules include respective read and write address decoders respectively connected to control respective random access memory arrays.

25. The integrated circuit of claim 22 wherein the network of conductors includes:

a plurality of respective local interface circuits which are disposed adjacent to respective programmable logic modules and which are programmable to form interconnections with respective adjacent programmable logic modules.

26. The integrated circuit of claim 22 wherein the network of conductors includes:

a plurality of respective local interface circuits which are disposed adjacent to respective programmable logic modules and which include programmable elements which are programmable to form interconnections with respective adjacent programmable logic modules; and a first plurality of global conductors which traverse the integrated circuit in a first direction and a second plurality of global conductors which traverse the integrated circuit in a second direction and which include a plurality of programmable elements for programmably interconnecting respective first and second conductors with respective local interface circuits.

27. The integrated circuit of claim 18 wherein the at least one programmable logic element of a respective programmable logic module is programmable to temporarily store at least one logic signal and to then provide such temporarily stored logic signal to a dedicated random access memory array.

28. The integrated circuit of claim 22 wherein the at least one programmable logic element of a respective programmable logic module is programmable to temporarily store at least one logic signal and to then provide such temporarily stored logic signal to a respective random access memory array of the respective programmable logic module.

29. A programmable logic device, comprising:

a plurality of logic blocks arranged in rows and columns, wherein each logic block includes at least one logic element having an input lead and an output lead;

at least one of said logic blocks includes at least one dedicated memory block used for storing user data; and a two dimensional array of interconnect coupling substantially all of the plurality logic blocks to each other.

30. The device of claim 29, wherein the logic element comprises a look-up table and flip-flop.

31. The device of claim 29, wherein each of the plurality of logic blocks includes a dedicated memory block used for storing user data.

32. The device of claim 29, wherein the dedicated memory blocks have input leads and output leads.

33. The device of claim 32, wherein two dimensional array of interconnect couples the output lead of at least one logic element to the input leads of at least one other logic element and at least one dedicated memory block and couples the output lead of at least one dedicated memory block to the input lead of at least one logic element and at least one dedicated memory block.

* * * * *